United States Patent
Ryu et al.

(10) Patent No.: US 10,062,623 B2
(45) Date of Patent: Aug. 28, 2018

(54) SEMICONDUCTOR PACKAGE SUBSTRATE, PACKAGE SYSTEM USING THE SAME AND METHOD FOR MANUFACTURING THEREOF

(71) Applicant: LG INNOTEK CO., LTD., Seoul (KR)

(72) Inventors: Sung Wuk Ryu, Seoul (KR); Dong Sun Kim, Seoul (KR); Seung Yul Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 12 days.

(21) Appl. No.: 14/401,602

(22) PCT Filed: May 24, 2013

(86) PCT No.: PCT/KR2013/004578
§ 371 (c)(1),
(2) Date: Nov. 17, 2014

(87) PCT Pub. No.: WO2013/176519
PCT Pub. Date: Nov. 28, 2013

(65) Prior Publication Data
US 2015/0130060 A1    May 14, 2015

(30) Foreign Application Priority Data

May 25, 2012  (KR) .................. 10-2012-0056356

(51) Int. Cl.
*H01L 23/12* (2006.01)
*H01L 23/00* (2006.01)
(Continued)

(52) U.S. Cl.
CPC .......... *H01L 23/12* (2013.01); *H01L 21/4846* (2013.01); *H01L 23/49816* (2013.01);
(Continued)

(58) Field of Classification Search
CPC .... H01L 24/11–24/13; H01L 23/49816; H01L 2224/11902; H01L 2224/05572
See application file for complete search history.

(56) References Cited

U.S. PATENT DOCUMENTS 4,764,804 A * 8/1988 Sahara ............... H01L 23/24
174/16.3
5,448,114 A * 9/1995 Kondoh ............. H01L 21/563
257/737
(Continued)

FOREIGN PATENT DOCUMENTS

CN     1585114 A    2/2005
CN   101150111 A    3/2008
(Continued)

OTHER PUBLICATIONS

TIPO Office Action for Taiwanese Patent Application No. 102118455 which corresponds to the above-identified U.S. application.
(Continued)

*Primary Examiner* — Julio J Maldonado
*Assistant Examiner* — Abbigale Boyle
(74) *Attorney, Agent, or Firm* — LRK Patent Law Firm

(57) ABSTRACT

A semiconductor package substrate includes an insulating substrate, a circuit pattern on the insulating substrate, a protective layer formed on the insulating substrate to cover the circuit pattern on the insulating substrate, a pad formed on the protective layer while protruding from a surface of the protective layer, and an adhesive member on the pad.

3 Claims, 10 Drawing Sheets

(51) Int. Cl.
*H01L 23/498* (2006.01)
*H01L 21/48* (2006.01)
*H05K 1/18* (2006.01)
*H01L 25/065* (2006.01)

(52) U.S. Cl.
CPC .............. *H01L 24/13* (2013.01); *H01L 24/17* (2013.01); *H01L 24/81* (2013.01); *H05K 1/181* (2013.01); *H01L 23/49822* (2013.01); *H01L 24/16* (2013.01); *H01L 25/0657* (2013.01); *H01L 2224/131* (2013.01); *H01L 2224/134* (2013.01); *H01L 2224/13147* (2013.01); *H01L 2224/16238* (2013.01); *H01L 2224/81192* (2013.01); *H01L 2224/81447* (2013.01); *H01L 2225/06517* (2013.01); *H01L 2225/06562* (2013.01); *H01L 2924/014* (2013.01); *H01L 2924/01029* (2013.01); *H01L 2924/12042* (2013.01); *H01L 2924/151* (2013.01); *H01L 2924/15787* (2013.01)

(56) References Cited

U.S. PATENT DOCUMENTS

| | | | |
|---|---|---|---|
| 5,917,157 A * | 6/1999 | Remsburg | H05K 1/0206 174/252 |
| 5,926,731 A | 7/1999 | Coapman et al. | |
| 6,784,087 B2 * | 8/2004 | Lee | H01L 24/11 228/180.22 |
| 7,045,900 B2 * | 5/2006 | Hikita | H01L 23/49575 257/777 |
| 7,271,483 B2 * | 9/2007 | Lin | H01L 21/4853 257/737 |
| 8,227,924 B2 * | 7/2012 | Shen | H01L 23/3171 257/775 |
| 2003/0060035 A1 | 3/2003 | Kimura et al. | |
| 2005/0095836 A1 | 5/2005 | Lai et al. | |
| 2006/0223230 A1 | 10/2006 | Hsu et al. | |
| 2007/0096313 A1 * | 5/2007 | Chou | H01L 23/5329 257/737 |
| 2007/0278670 A1 | 12/2007 | Kimura et al. | |
| 2008/0179740 A1 * | 7/2008 | Liao | H01L 23/49816 257/738 |
| 2009/0008801 A1 * | 1/2009 | Lai | H01L 23/3677 257/782 |
| 2010/0084765 A1 * | 4/2010 | Lee | H01L 24/13 257/738 |
| 2010/0295179 A1 | 11/2010 | Watanabe et al. | |
| 2011/0003431 A1 | 1/2011 | Huang | |
| 2011/0286191 A1 | 11/2011 | Kim et al. | |
| 2013/0043583 A1 * | 2/2013 | Wu | H01L 23/3171 257/737 |

FOREIGN PATENT DOCUMENTS

| | | |
|---|---|---|
| EP | 0889512 A2 | 1/1999 |
| EP | 1843391 A1 | 10/2007 |
| JP | 2003-110052 A | 4/2003 |
| KR | 10-2000-0002962 A | 1/2000 |
| KR | 10-2006-0085464 A | 7/2006 |
| KR | 10-2006-0094248 A | 8/2006 |
| KR | 10-2011-0029466 A | 3/2011 |
| TW | 200832653 A | 8/2008 |

OTHER PUBLICATIONS

European Search Report for European Patent Application No. 13793826 which corresponds to the above-identified U.S. application.

Search Report for International Application No. PCT/KR2013/004578.

SIPO Office Action for Chinese Patent Application No. 201380033607.3 which corresponds to the above-referenced U.S. application.

TIPO Office Action dated Jul. 7, 2017 for Taiwanese Patent Application No. 102118455 which corresponds to the above-referenced U.S. application.

TIPO office action dated Dec. 5, 2017 for Taiwanese Patent Application No. 102118455 which corresponds to the above-referenced U.S. application.

* cited by examiner

[Fig. 1]
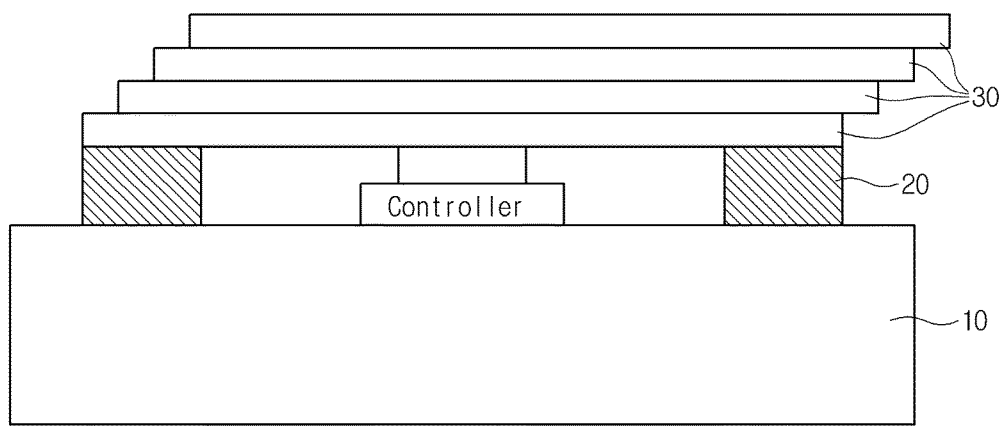
[Fig. 2]
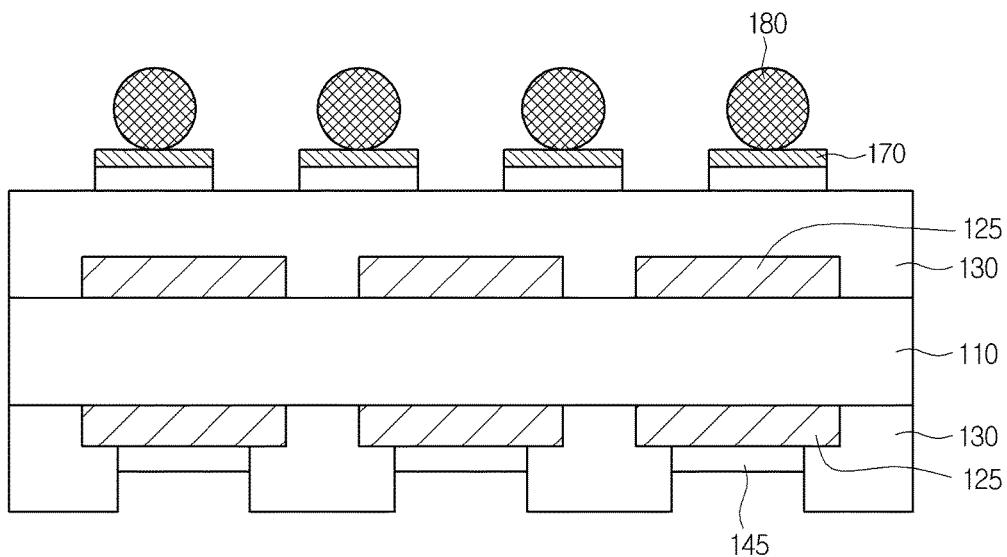
[Fig. 3]
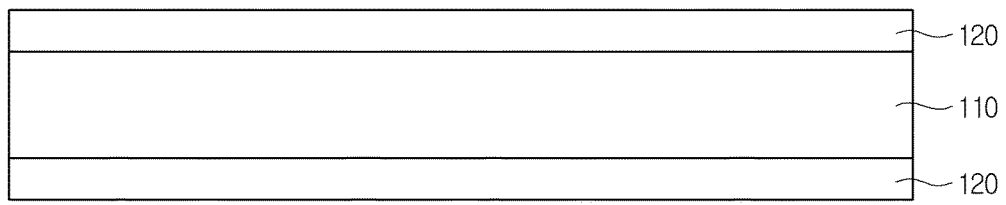

[Fig. 4]
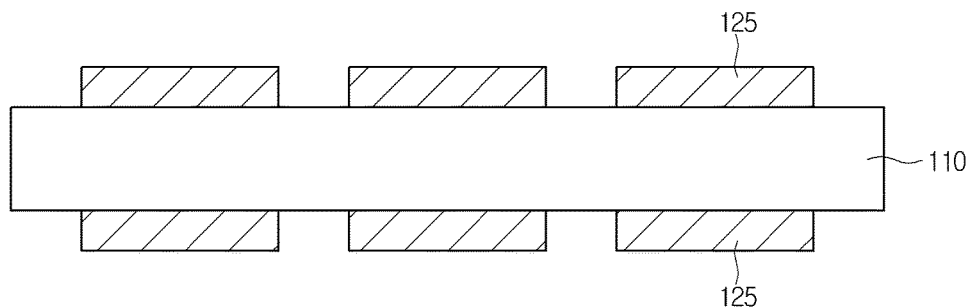
[Fig. 5]
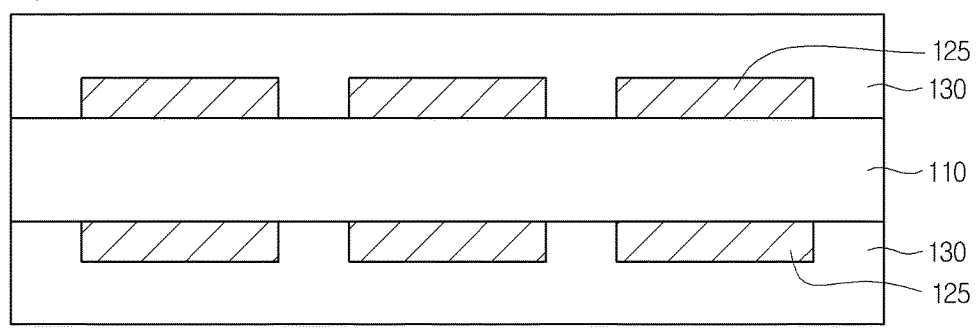
[Fig. 6]
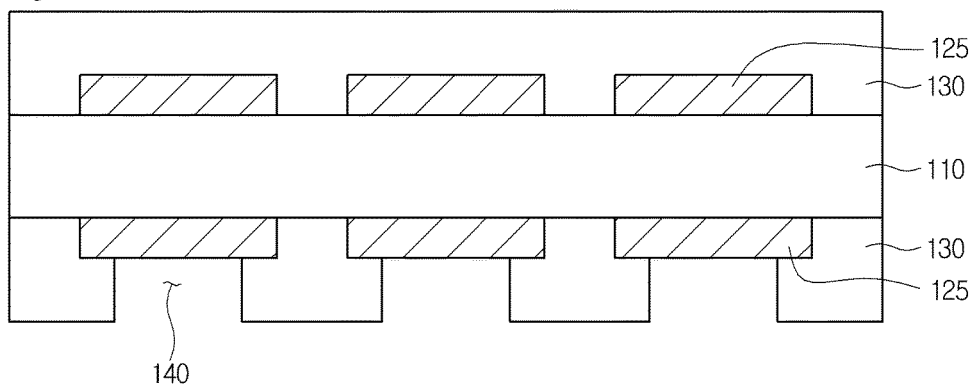
[Fig. 7]
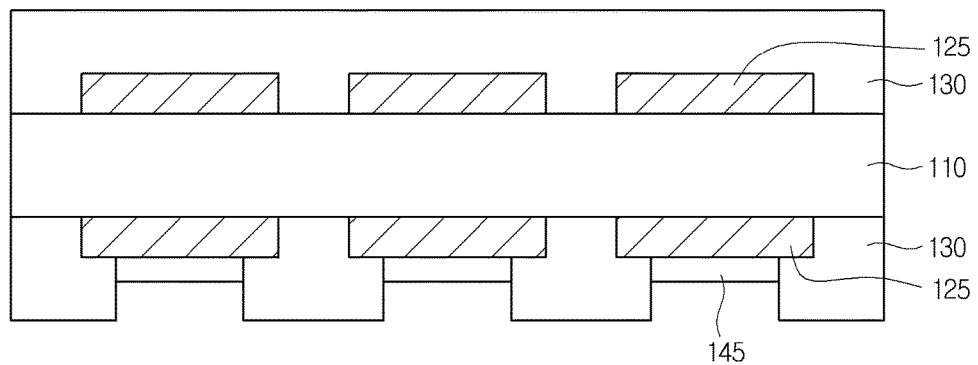

[Fig. 8]
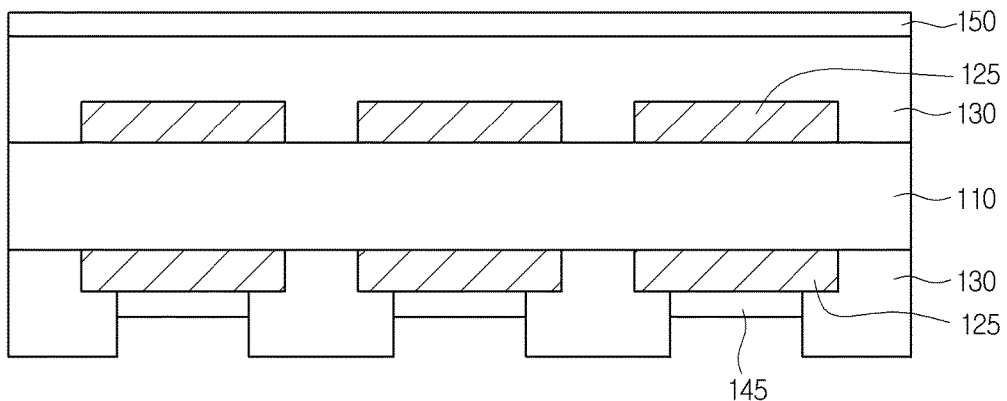
[Fig. 9]
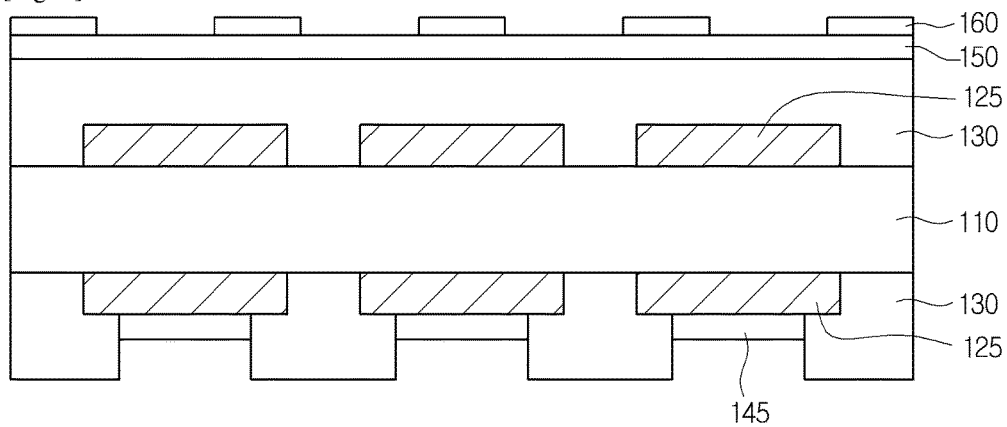
[Fig. 10]
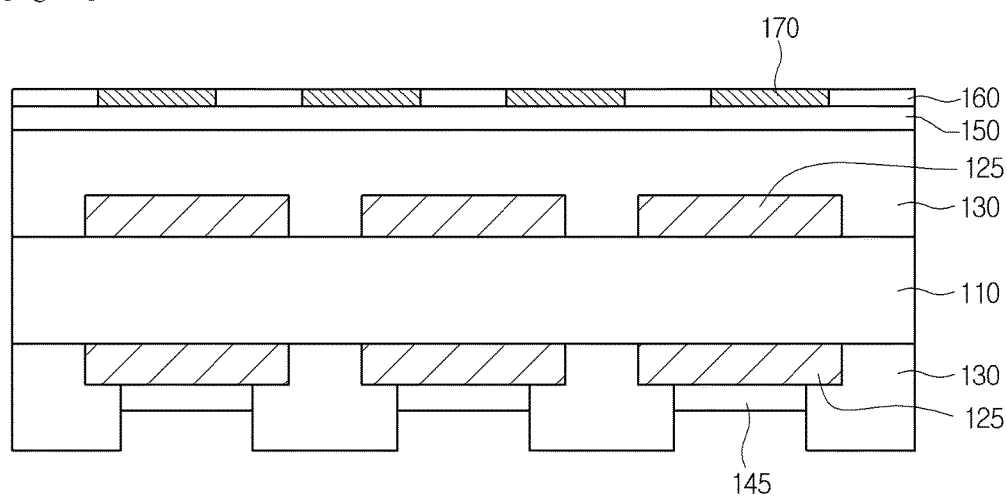

[Fig. 11]
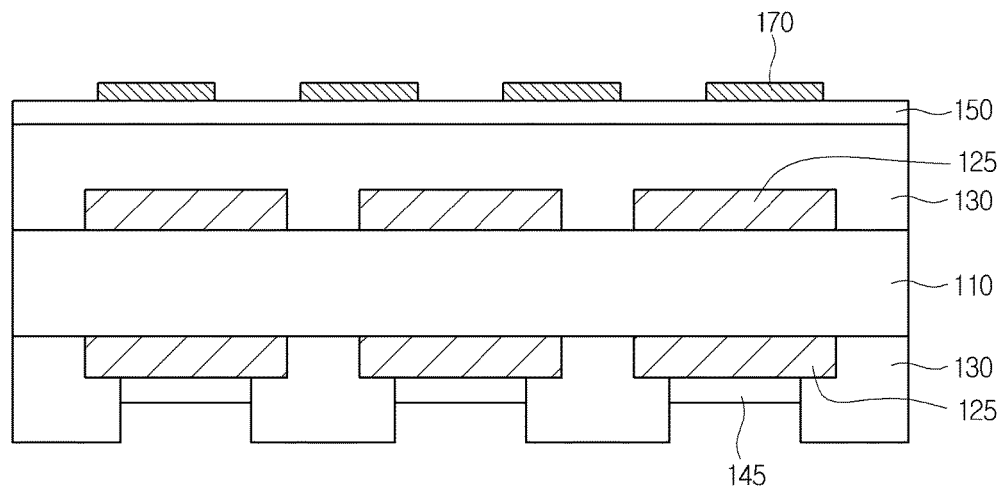
[Fig. 12]
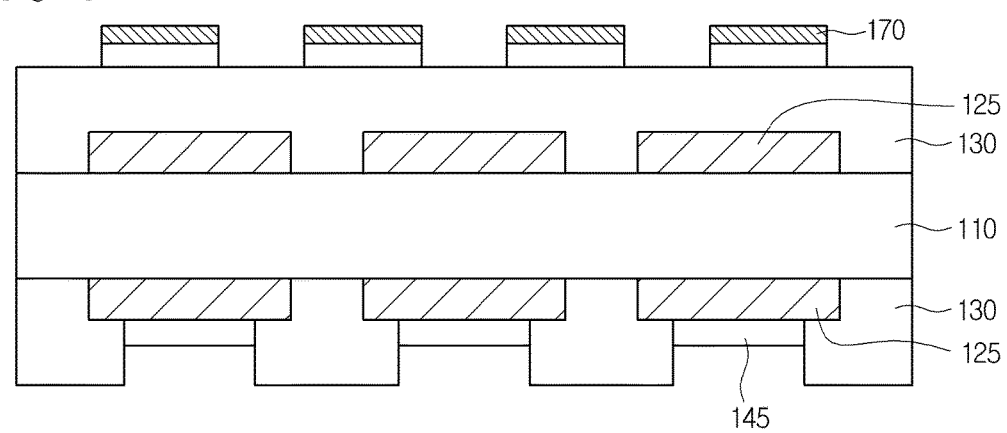
[Fig. 13]
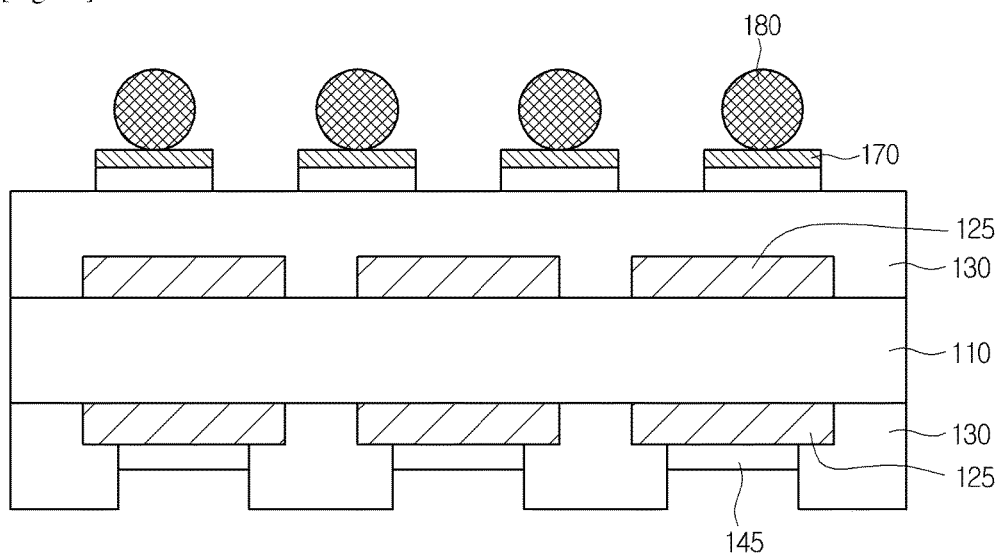

[Fig. 14]
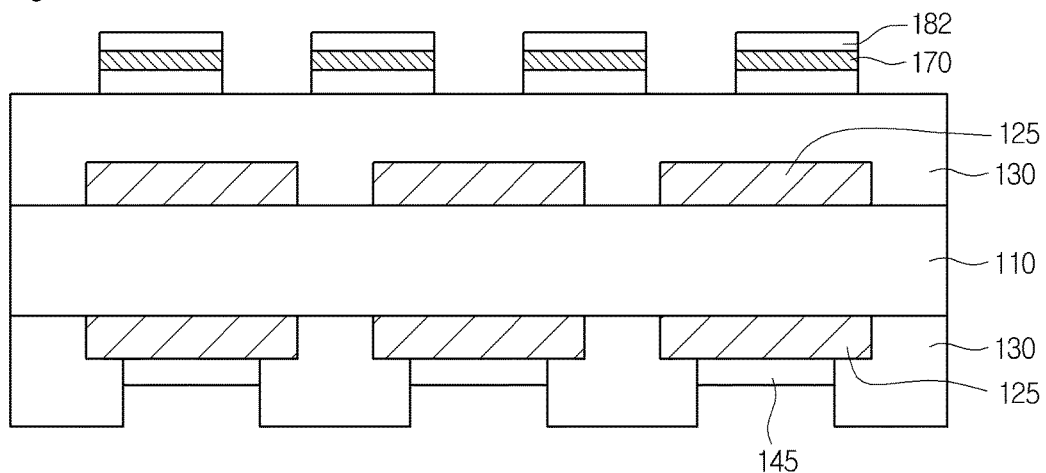
[Fig. 15]
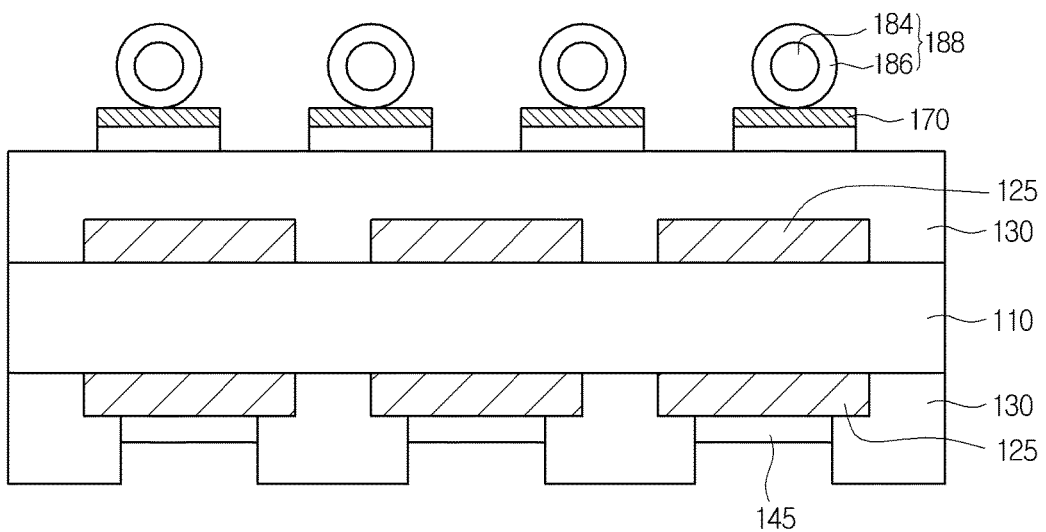

[Fig. 16]
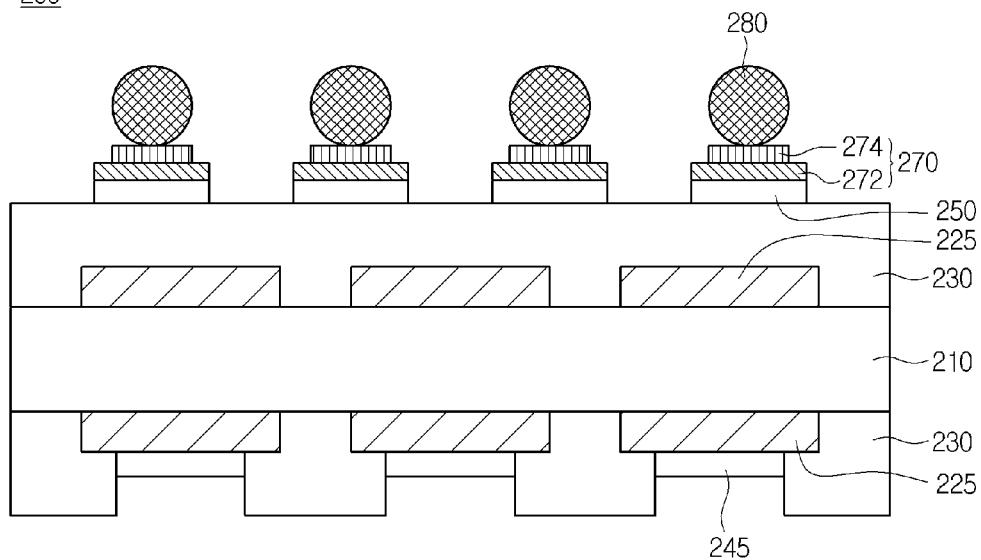
[Fig. 17]
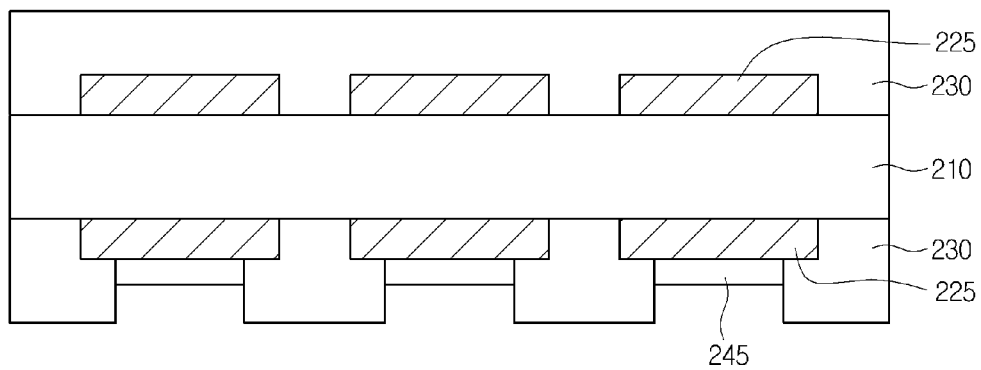
[Fig. 18]
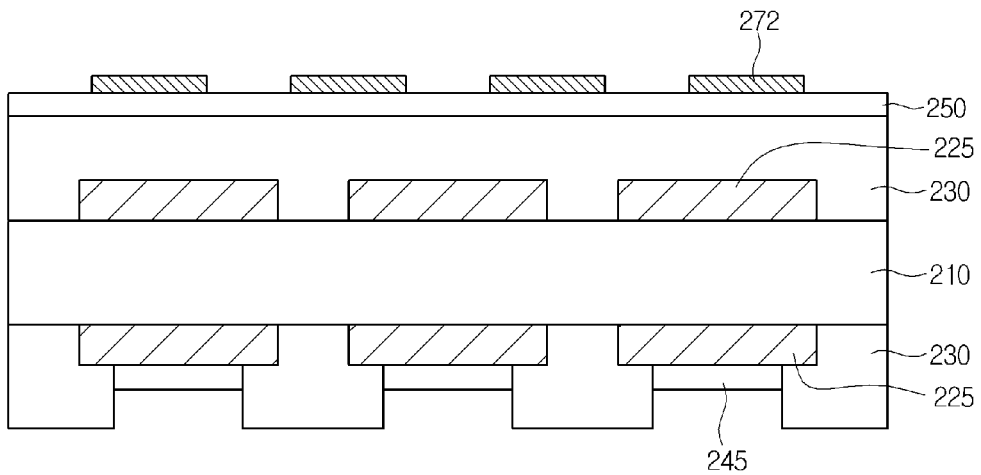

[Fig. 19]
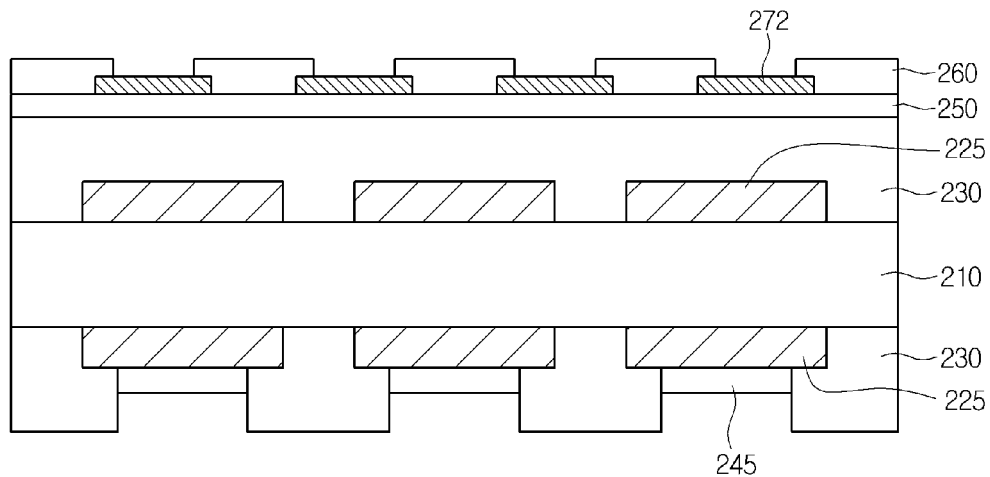
[Fig. 20]
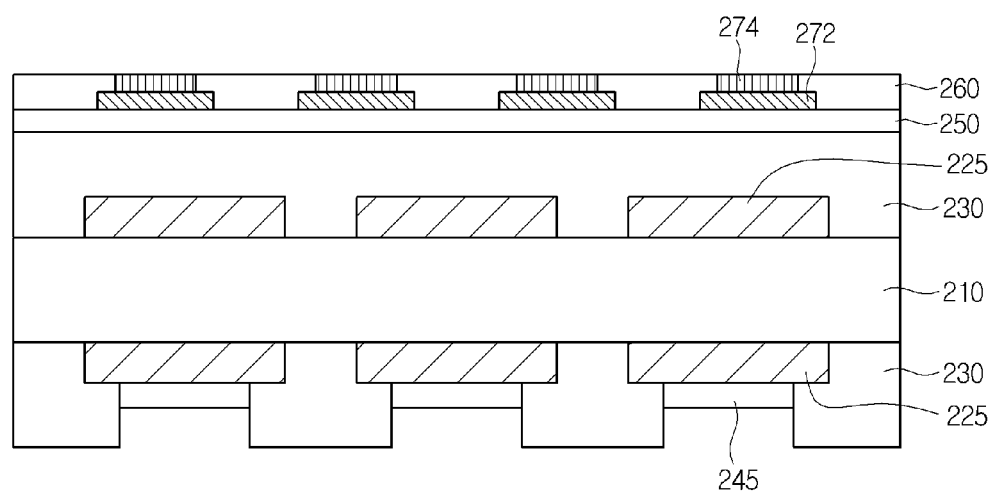
[Fig. 21]
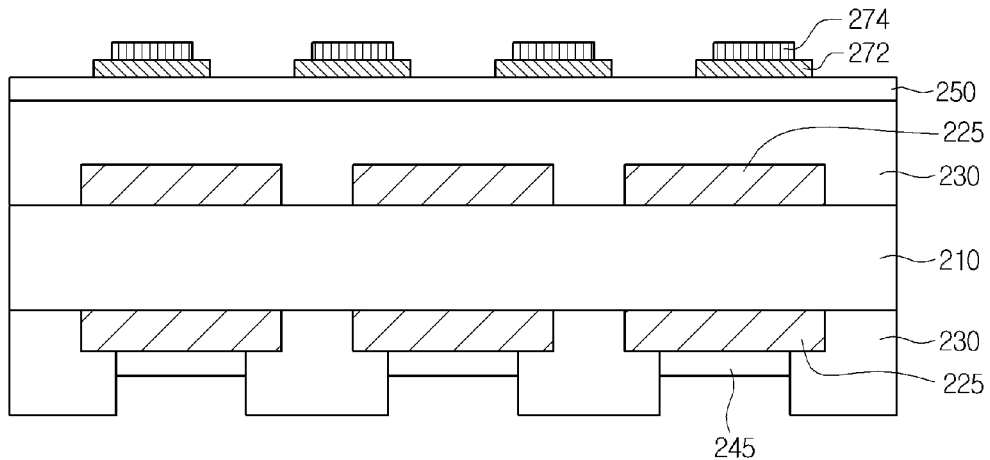

[Fig. 22]
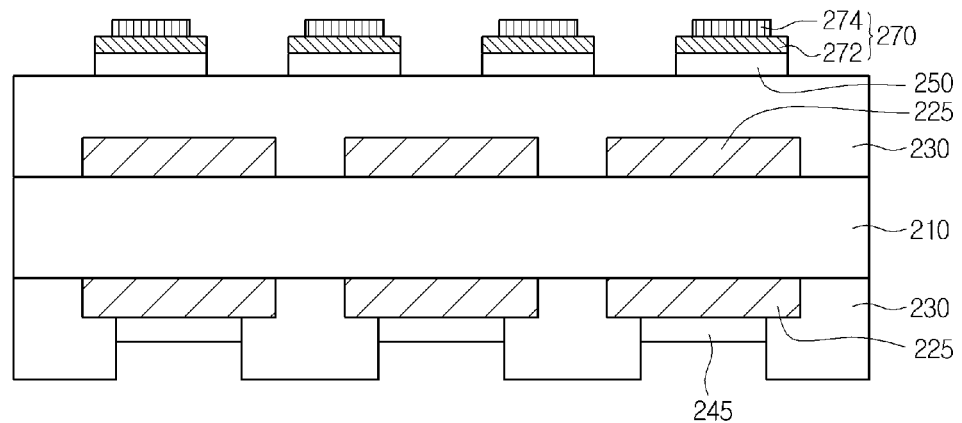
[Fig. 23]
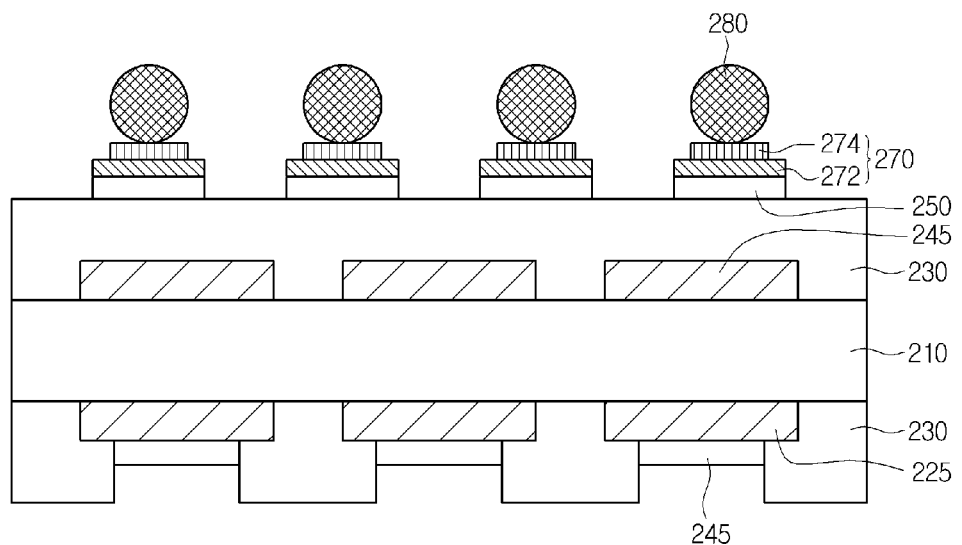
[Fig. 24]
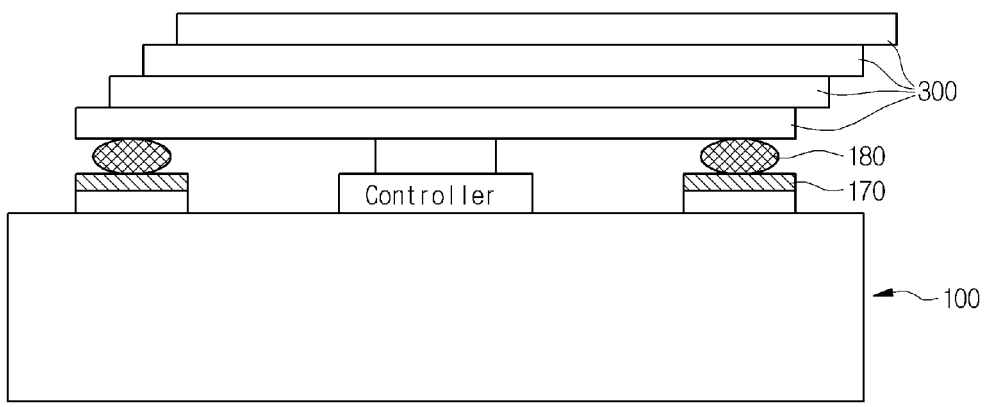

[Fig. 25]
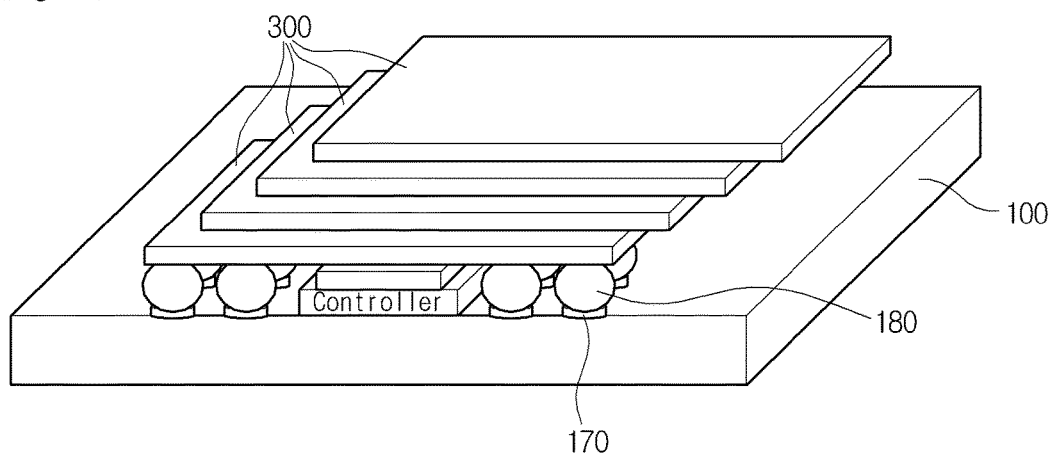

[Fig. 26]
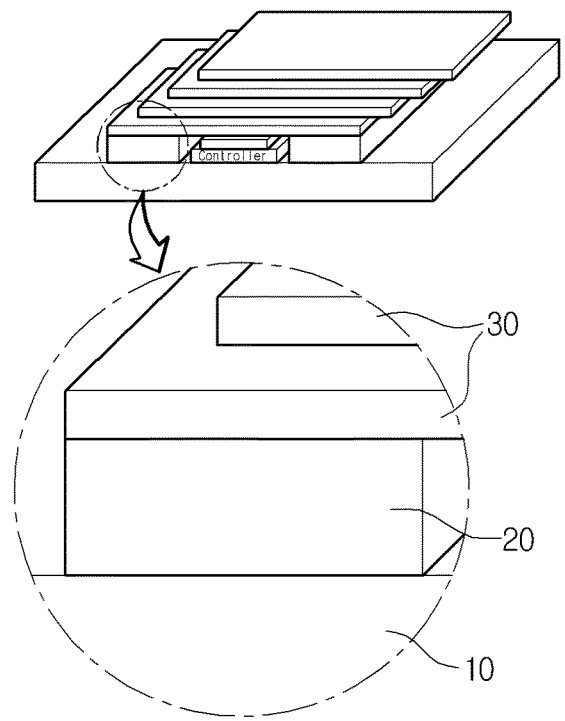
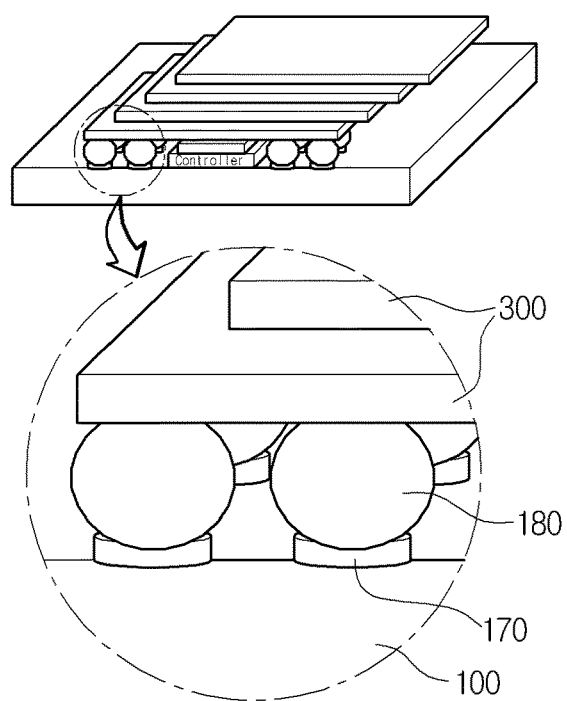

SEMICONDUCTOR PACKAGE SUBSTRATE, PACKAGE SYSTEM USING THE SAME AND METHOD FOR MANUFACTURING THEREOF

TECHNICAL FIELD

The embodiment relates to a semiconductor substrate, and more particularly, to a semiconductor package substrate for a flash memory, a flash memory using the same, and a method for fabricating the same.

BACKGROUND ART

As electrical/electronic appliances have been advanced with high performance, the technology for attaching a greater number of packages onto a substrate having a limited size has been proposed and studied. However, since it is a rule to mount only one semiconductor chip in a package, there is limitation to obtain a desired capacity.

As a method of increasing a capacity of a memory chip, that is, as a method of achieving high integration, the technology of installing a greater number of cells in a limited space has been generally known to those skilled in the art. However, such a method requires a high level technology such as a precise design rule, and a lot of development time. Thus, as a method for easily achieving high integration, a stacking technique has been developed and the study for the sacking technique has been currently performed very actively.

To this end, an MCP (Multi Chip Package) technique has been recently utilized.

The MCP is a semiconductor product prepared in the form of one package by stacking several memory chips, so the MCP not only reduces the volume of the semiconductor product, but also increases the data storage capacity, so that the MCP is mainly used in portable electronic equipment such as a mobile phone.

In this case, since several tens of semiconductor chips are stacked to be stably operated while minimizing the thickness thereof, the high level technique is required from the design stage to the production stage.

FIG. 1 is a view showing a package system according to the related art.

Referring FIG. 1, the package system includes a semiconductor package substrate 10, a dummy die 20, and a memory chip 30.

The semiconductor package substrate 10 includes at least one circuit pattern formed on an insulation substrate. A protection layer for protecting the circuit pattern is formed on the circuit pattern (uppermost layer of the semiconductor package substrate 10).

The memory chip 30 may be a NAND flash memory chip.

The dummy die 20 is formed between the semiconductor substrate 10 and the memory chip 30.

The dummy die 20 provides an attaching space for allowing the memory chip 30 to be attached onto the semiconductor substrate 10 while spacing the semiconductor substrate 10 from the memory chip 30.

However, since the package system described above must form the dummy die 20 between the semiconductor substrate 10 and the memory chip 30 for stacking the memory chip 30, an additional process is required in addition to a process for fabricating the semiconductor substrate 10, so that productivity of a manufacturer is reduced.

Further, since the dummy die 20 is formed of an expensive silicon material, a cost of the entire package system is increased.

In addition, since the silicon dummy die 20 has a predetermined thickness, the entire thickness of the package system is increased.

DISCLOSURE OF INVENTION

Technical Problem

The embodiment provides a semiconductor package substrate having a novel structure, a package system using the same, and a method for manufacturing the same.

In addition, the embodiment provides a semiconductor package substrate capable of improving the productivity of a package system and reducing the cost of the package system.

The technical objects which will be achieved in the proposed embodiments are not limited to the above, but other technical objects which are not mentioned will be apparently understood to those skilled in the art.

Solution to Problem

According to the embodiment, there is provided a semiconductor package substrate including an insulating substrate, a circuit pattern on the insulating substrate, a protective layer formed on the insulating substrate to cover the circuit pattern on the insulating substrate, a pad formed on the protective layer while protruding from a surface of the protective layer, and an adhesive member on the pad.

In addition, the pad has a shape of a column having a lower width and an upper width equal to each other.

Further, the adhesive member provides an adhesive strength between the pad and a semiconductor chip attached onto the pad.

In addition, the pad includes a plating seed layer formed at a lower portion of the pad.

In addition, the pad includes a first pad, which is formed on the protective layer and has a first width, and a second pad which is formed on the first pad and has a second width different from the first width.

Further, the second width of the second pad is narrower than the first width of the first pad.

In addition, the adhesive member includes one of a solder ball, a micro-ball, an adhesive paste, and a copper core solder ball.

In addition, the protective layer includes one of solder resist (SR), oxide, and gold (Au).

Further, the pad makes contact with a top surface of the protective layer without making contact with the circuit pattern and the insulating substrate.

Meanwhile, according to the embodiment, there is provided a package system including a semiconductor package substrate including an insulating substrate, a circuit pattern on one surface of the insulating substrate, and a protective layer formed on the insulating substrate to cover the circuit pattern, and a semiconductor chip attached to the semiconductor package substrate. The semiconductor package substrate comprises a pad formed on the protective layer through a plating scheme, and an adhesive member formed on the pad, and the semiconductor chip is attached onto the pad, which is formed on the semiconductor package substrate, by the adhesive member.

In addition, the pad has a shape of a column having a lower width and an upper width equal to each other.

In addition, the pad includes a first pad, which is formed on the protective layer and has a first width, and a second pad which is formed on the first pad and has a second width different from the first width, and wherein the semiconductor chip is attached onto the second pad by the adhesive member formed on the second pad.

Further, the second width of the second pad is narrower than the first width of the first pad.

In addition, the adhesive member includes one of a solder ball, a micro-ball, an adhesive paste, and a copper core solder ball.

In addition, the pad makes contact with a top surface of the protective layer without making contact with the circuit pattern and the insulating substrate.

Meanwhile, according to the embodiment, there is provided a method for manufacturing a package system. The method includes forming a circuit pattern on at least one surface of an insulating substrate, forming a protective layer on the insulating substrate to cover the circuit pattern, attaching a dry film, which has an opening to expose a region for formation of a pad, on the protective layer, forming the pad on the protective layer by filling the opening of the dry film, and forming an adhesive member on the formed pad.

In addition, the opening of the dry film has a lower width and an upper width equal to each other, and the pad has a shape of a column, which has a lower width and an upper width equal to each other, corresponding to a shape of the opening.

Further, in the forming of the pad on the protective layer by filling the opening of the dry film, the pad makes contact with the protective layer without making contact with the insulating substrate and the circuit pattern.

In addition, the method further includes forming a plating seed layer on the protective layer, wherein the formed pad includes the plating seed layer formed at a lower portion of the pad.

Further, the attaching of the dry film, which has the opening to expose the region for formation of the pad, on the protective layer includes forming a first dry film, which has an opening having a first width, on the protective layer, and forming a second dry film, which has an opening having a second width, on the first dry film. The first width is different from the second width.

In addition, the forming of the pad on the protective layer by filling the opening of the dry film includes forming a first pad by filling the opening of the first dry film, forming a second pad by filling the opening of the second dry film. The second pad is narrower than the first pad.

Further, the forming of the adhesive member on the formed pad include forming at least one of a solder ball, a micro-ball, an adhesive paste, and a copper core solder ball on the pad.

In addition, the method further includes attaching a semiconductor chip on the adhesive member.

Advantageous Effects of Invention

As described above, according to the embodiment, the copper pad and the adhesive member are formed on the semiconductor package without the expensive dummy die, so that the productivity of a package system can be improved and the product cost can be reduced In addition, according to the embodiment, the pad is formed by using the stack structure of multiple layers having different widths, thereby improving the adhesive strength with the adhesive member, so that the reliability of the semiconductor package substrate can be improved.

Further, according to the embodiment, the copper ball is used instead of the expensive dummy die, so that the fine pitch can be realized.

In addition, according to the embodiment, the second adhesive member is formed by using the copper core solder ball, so that the high stand-off height can be maintained after the reflow process has been performed. Accordingly, the reliability of the semiconductor package substrate can be improved.

BRIEF DESCRIPTION OF DRAWINGS

FIG. 1 is a view showing a package system according to the related art;

FIG. 2 is a sectional view showing a semiconductor package substrate according to the first embodiment;

FIGS. 3 to 15 are sectional views showing a method for fabricating the semiconductor package substrate shown in FIG. 2 in the sequence of process steps;

FIG. 16 is a view showing a semiconductor package substrate according to the second embodiment;

FIGS. 17 to 23 are sectional views showing the method for fabricating the semiconductor package substrate shown in FIG. 16 in the sequence of the process steps;

FIGS. 24 and 25 are views showing a package system according to the embodiment; and FIG. 26 illustrates the comparison in the package system between the related art and the embodiment.

MODE FOR THE INVENTION

The embodiment of the disclosure will be described in detail with reference to accompanying drawings, so that those skilled in the art to which the disclosure pertains can easily realize the embodiment. However, the disclosure can be realized in various modifications, and is not limited to the embodiment.

In the following description, when a predetermined part "includes" a predetermined component, the predetermined part does not exclude other components, but may further include other components if there is a specific opposite description.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

In the description of the embodiments, it will be understood that, when a part is referred to as being "on" or "under" another part, it can be "directly" or "indirectly" on the other part, or one or more intervening parts may also be present. Such a position of the part has been described with reference to the drawings.

The embodiment provides a semiconductor package substrate capable of improving the productivity of a package system and reducing the product cost by forming a copper pad and an adhesive member on the semiconductor package substrate through a hybrid bump technology without using an expensive dummy die.

FIG. 2 is a view showing a semiconductor package substrate according to a first embodiment.

Referring to FIG. 2, a semiconductor package substrate 100 according to the first embodiment includes an insulating substrate 110, a circuit pattern 125 formed on at least one surface of the insulating substrate 110, a protective layer 130 formed on the insulating substrate 110 to protect the circuit pattern 120, a first adhesive member 145 formed on the circuit pattern 125 formed on an opposite surface to a surface, on which a semiconductor chip 300 (which will be described layer) is formed, in the insulating substrate 110, a pad 170 on the protective layer 130 provided on the top surface of the insulating substrate 110, and a second adhesive member 180 formed on the pad 170.

The insulating plate 110 may include thermosetting substrate, thermoplastic polymer substrate, a ceramic substrate, an organic-inorganic composite material substrate, or a glass fiber impregnation substrate. If the insulating plate 110 includes a polymer resin, the insulating plate 110 may include an epoxy-based insulating resin, or may include polyimide-based resin.

The insulating plate 110 is formed on at least one surface thereof with the circuit pattern 125.

In addition, circuit patterns 125 may include conductive material, and may be formed by simultaneously patterning a copper film formed on both surfaces of the insulating substrate 110.

The circuit pattern 125 may be made of the alloy including copper (Cu) and may have surface roughness.

The insulating substrate 110 is provided thereon with the protective layer 130 covering the circuit pattern 125 formed on the top surface of the insulating substrate 110 while exposing a portion of the surface of the circuit pattern 125 formed on the bottom surface of the insulating substrate 110.

The protective layer 130 is to protect the surface of the insulating substrate 110. The protective layer 130 is formed throughout the entire surface of the insulating substrate 110. The protective layer 130 has an opening (not shown) to open the surface of the circuit pattern 125 to be exposed, that is, the surface of the stacking structure of the circuit pattern 125 formed on the bottom surface of the insulating substrate 110.

The protective layer 130 may include at least one layer including one of solder resist (SR), an oxide, and gold (Au).

The first adhesive member 145 is formed on the surface of the circuit pattern 125 exposed through the protective layer 130.

The first adhesive member 145 is formed for the purpose of attaching a conductive ball to the insulating substrate 110 in order to package the semiconductor package substrate 100 together with an additional substrate thereafter.

The protective layer 130 is provided thereon with the pad 170.

The pad 170 is formed on the protective layer 130 to cover the entire surface of the circuit pattern 125, and does not make contact with the insulating substrate 110 or the circuit pattern 125.

The pad 170 may include a conductive material. For example, the pad 170 may include copper (Cu).

The pad 170 is formed on the protective layer 130 for the purpose of attaching the semiconductor chip onto the semiconductor package substrate 100 thereafter.

In other words, according to the related art, in order to attach the semiconductor chip 300, a dummy die including silicon is formed on the semiconductor package substrate regardless of the fabrication of the semiconductor package substrate 100. However, according to the present embodiment, instead of the dummy die, the pad 170 is formed on the protective layer 130 through a hybrid bump technology in the fabrication process of the semiconductor package The second adhesive member 180 is formed on the pad 170.

The second adhesive member 180 is formed on the pad 170 to provide the adhesive strength between the semiconductor chip 300 and the semiconductor package substrate 100.

The second adhesive member 180 may have the typical form of a solder ball. Alternatively, the second adhesive member 180 may be formed by using an adhesive paste or a copper core solder ball.

In addition, the adhesive paste may include a conductive material for the electrical conduction. If the adhesive paste includes the conductive material, the conductive material may preferably include one selected from the group consisting of copper (Cu), silver (Ag), gold (Au), aluminum (Al), a carbon nano-tube, and the combination thereof.

As described above, according to the embodiment, the copper pad and the adhesive member are formed on the semiconductor package substrate without the expensive dummy die, so that the productivity of a package system can be improved and the product cost can be reduced In addition, as described above, according to the embodiment, the copper ball is used instead of the expensive dummy die, so that the fine pitch is possible.

Further, as described above, according to the embodiment, the second adhesive member is formed by using a copper core solder ball 188, so that the high stand-off height can be maintained after the reflow process has been performed. Accordingly, the reliability of the semiconductor package substrate can be improved.

FIGS. 3 to 15 are sectional views showing a method for fabricating the semiconductor package substrate shown in FIG. 2 in the sequence of process steps.

First, after preparing the insulating substrate 110 as shown in FIG. 3, a metallic layer 120 is stacked on at least one surface of the insulating substrate 110.

If the insulating substrate 110 includes an insulating layer, the stack structure of the insulating layer and the metallic layer 120 may be a copper clad laminate (CCL) structure.

In addition, the metallic layer 120 may be formed on the insulating substrate 110 by performing an electroless plating scheme. If the metallic layer 120 is formed through the electroless plating scheme, the roughness is applied to the surface of the insulating substrate 110, so that the plating process can be smoothly performed.

The insulating substrate 110 may include epoxy-based resin or polyimide-based resin instead of the expensive ceramic material representing high thermal conductivity. The metallic layer 120 may include a copper thin film including copper high electrical conductivity and low resistance.

Thereafter, as shown in FIG. 4, the circuit pattern 125 is formed by etching metallic layers 120, which are formed at the upper and lower portions of the insulating substrate 110, at a predetermined pattern.

In this case, the circuit pattern 125 may be formed through the etching process based on the photolithography process or through a laser process to directly form a pattern by using the laser.

In addition, the circuit pattern 125 may be formed on the upper and lower portions of the insulating substrate 110. Alternatively, the circuit pattern 125 may be formed only on the upper portion of the insulating substrate 110.

Next, as shown in FIG. 5, the protective layer 130 is formed on the upper and lower portions of the insulating substrate 110 to bury the circuit pattern 125.

The protective layer 130 is to protect the surface of the insulating substrate 110 or the circuit pattern 125. The protective layer 130 may include at least one layer including one of solder resist (SR), an oxide, and gold (Au).

Next, as shown in FIG. 6, the protective layer 130 formed on the lower portion of the insulating substrate 110 is processed, thereby exposing the surface of the circuit pattern 125 formed on the bottom surface of the insulating substrate 110.

In other words, the protective layer 130 formed under the insulating substrate 110 is processed by a laser to form the opening 140 to expose the surface of the circuit pattern 125 formed under the insulating substrate 110.

The laser process is a cutting scheme to melt and evaporate a portion of a material by concentrating optical energy on a surface so that the surface has a desired shape. According to the laser process, the complex shape can be easily processed through a computer program, and mixed material, which may not be easily cut through another scheme, can be processed.

In addition, the laser process has an advantage in that the cut diameter may be formed to at least 0.005 mm A laser drill for the laser process preferably includes an yttrium aluminum garnet (YAG), a $CO_2$ laser, or an ultraviolet (UV) laser. The YAG laser may process both of the copper film and the insulating layer, and the $CO_2$ laser may process only the insulating layer.

In this case, preferably, the laser process is performed by using the UV laser, so that the opening 140 having a smaller diameter may be formed.

In addition, the opening 140 may expose only a portion of the circuit pattern 125.

In other words, the opening 140 may have a width narrower than that of the circuit pattern 125, so that only the edge region of the circuit pattern 125 may be protected by the protective layer 130.

Thereafter, as shown in FIG. 7, the first adhesive member 145 is formed on the circuit pattern 125 exposed by the opening 140.

The first adhesive member 145 may be formed by coating an adhesive paste on the circuit pattern 125 exposed through the opening 140 by employing the protective layer 130 as a mask.

The first adhesive member 145 is used to attach the solder ball, which provides an adhesive strength, between the semiconductor package substrate 100 and another substrate, so that the semiconductor package 100 is attached to the substrate.

Thereafter, as shown in FIG. 8, a plating seed layer 150 is formed on the protective layer 130 formed at the upper portion of the insulating substrate 110 as shown in FIG. 8.

The plating seed layer 150 may be formed through the chemical copper plating scheme.

The chemical copper plating scheme may be performed in the sequence of a degreasing process, a soft etching process, a pre-catalyst process, a catalyst treatment process, an accelerator process, an electroless plating process, and an anti-oxidation treatment process.

In addition, the copper plating scheme is classified into a heavy copper plating scheme (the thickness of about 2), a medium copper plating scheme (the thickness of 1 to 2), and a light copper plating scheme (the thickness of 1 or less) according to the thicknesses. In this case, the plating seed layer 150 having the thickness of 0.5 to 1.5 is formed through the medium copper plating scheme or the light copper plating scheme.

Thereafter, as shown in FIG. 9, a dry film 160 is formed on the plating seed layer 150.

The dry film 160 may have a window to open a portion opposite to the region in which the pad 170 is formed.

In this case, the dry film 160 may surround the entire surface of the plating seed layer 150, so that the window to open the region for the pad 170 may be formed.

Thereafter, as shown in FIG. 10, the pad 170 is formed on the plating seed layer 150 to bury the open window of the dry film 160.

The pad 170 may be formed by electroless-plating metal such as copper (Cu) using the plating seed layer 150 as a seed layer.

Thereafter, as shown in FIG. 11, the dry film 160 is delaminated.

Subsequently, as shown in FIG. 12, the plating seed layer 150 formed on the remaining region is removed except for the region for the pad 170.

In this case, a portion of the plating seed layer 150 exists under the pad 170, so that the whole structure of the pad 170 includes the plating seed layer 150.

As described above, the pad 170 including the plating seed layer 130 is formed on the protective layer 130.

Next, as shown in FIG. 13, the second adhesive member 180 is formed on the pad 170.

In this case, the second adhesive member 180 according to the first embodiment may be formed by using a solder ball, or a micro-ball.

The second adhesive member 180 may be formed on the pad 170 through a flux printing scheme, a ball printing scheme, a reflow scheme, a deflux scheme, and a coining scheme.

Alternatively, as shown in FIG. 14, the second adhesive member 180 may be formed on the pad 170 by coating the adhesive paste 182 on the pad 170.

In addition, alternatively, as shown in FIG. 15, the second adhesive member 180 may be formed on the pad 170 by using a copper core solder ball 188 including a copper ball 184 and a solder ball 186 surrounding the circumference of the copper ball 184.

As described above, the pad 170 constituting the semiconductor package substrate 100 according to the first embodiment protrudes from the protective layer 130 and has the same width in the top and bottom surfaces.

As described above, according to the embodiment, the copper pad and the adhesive member are formed on the semiconductor package substrate through the hybrid bump technology without the expensive dummy die, so that the productivity of a package system can be improved and the product cost can be reduced In addition, as described above, the second adhesive member 180 is formed by using the copper core solder ball 188, so that the high stand-off height can be maintained after the reflow process has been performed. Accordingly, the reliability of the semiconductor substrate can be improved.

FIG. 16 is a view showing a semiconductor package substrate according to the second embodiment.

Referring to FIG. 16, a semiconductor package substrate 200 according to the second embodiment includes an insulating substrate 210, a circuit pattern 225 formed on at least one surface of the insulating substrate 210, a protective layer 230 formed on the insulating substrate 210 to protect the circuit pattern 225, a first adhesive member 245 formed on the circuit pattern 225 formed on an opposite surface to a surface, on which a semiconductor chip 300 (which will be described layer) is formed, in the insulating substrate 210, a pad 270 formed on the protective layer 230 provided on the top surface of the insulating substrate 210, and a second adhesive member 280 formed on the pad 270.

The pad 170 includes a first pad 272 formed on the protective layer 230 and a second pad 274 formed on the first pad 272.

The insulating plate 210 may include thermosetting substrate, thermoplastic polymer substrate, a ceramic substrate, an organic-inorganic composite material substrate, or a glass fiber impregnation substrate. If the insulating plate 210 includes a polymer resin, the insulating plate 210 may include an epoxy-based insulating resin, or may include polyimide-based resin.

The circuit pattern 225 is formed on at least one surface of the insulating substrate 210.

In addition, circuit patterns 225 may include conductive material, and may be formed by simultaneously patterning a copper film formed on both surfaces of the insulating substrate 210.

The circuit pattern 225 may be made of the alloy including copper (Cu) and may have surface roughness.

The insulating substrate 210 is provided thereon with the protective layer 230 covering the circuit pattern 225 formed on the top surface of the insulating substrate 210 while exposing a portion of the surface of the circuit pattern 225 formed on the bottom surface of the insulating substrate 210.

The protective layer 230 is to protect the surface of the insulating substrate 210. The protective layer 230 is formed throughout the entire surface of the insulating substrate 210. The protective layer 230 has an opening (not shown) to open the surface of the circuit pattern 225 to be exposed, that is, the surface of the stacking structure of the circuit pattern 225 formed on the bottom surface of the insulating substrate 210.

The protective layer 230 may include at least one layer including one of solder resist (SR), an oxide, and gold (Au).

The first adhesive member 245 is formed on the surface of the circuit pattern 225 exposed through the protective layer 230.

The first adhesive member 245 is formed for the purpose of attaching a conductive ball to the insulating substrate 210 in order to package the semiconductor package substrate 200 together with an additional substrate thereafter.

The protective layer 230 is provided thereon with the pad 270.

The pad 270 is formed on the protective layer 230 to cover the entire surface of the circuit pattern 225, and does not make contact with the insulating substrate 210 or the circuit pattern 225.

The pad 270 may include a conductive material. For example, the pad 270 may include copper (Cu).

The pad 270 is formed on the protective layer 230 for the purpose of attaching the semiconductor chip 300 onto the semiconductor package substrate 200 thereafter.

In this case, the pad 270 includes a plurality of layers.

In other words, the pad 270 includes the first pad 272 formed on the protective layer 230 and the second pad 274 formed on the first pad 272.

The first pad 272 has the same width in the top and bottom surfaces thereof, and is formed on the protective layer 230.

Even the second pad 274 has the same width in the top and bottom surfaces thereof, and is formed on the first pad 272.

In this case, the width of the first pad 272 may have the first width, and the second pad 274 may have the second width narrower than the first width.

In other words, according to the first embodiment, the pad 170 is formed in a single layer for the purpose of the attachment to the semiconductor chip 300.

However, according to the second embodiment, the first and second pads 272 and 274 are formed in multiple layers for the purpose of the attachment to the semiconductor chip 300. In this case, the width of the second pad 274 is narrower than the width of the first pad 272, so that the adhesive strength with the second adhesive member, which is formed thereafter, may be improved.

The second adhesive member 280 is formed on the second pad 274.

The second adhesive member 280 is formed on the second pad 274 to provide the adhesive strength between the semiconductor chip 300 and the semiconductor package substrate 200.

The second adhesive member 280 may have the typical form of a solder ball. Alternatively, the second adhesive member 280 may be formed by using the adhesive paste or the copper core solder ball.

In addition, the adhesive paste may include a conductive material for the electrical conduction. If the adhesive paste includes the conductive material, the conductive material may preferably include one selected from the group consisting of copper (Cu), silver (Ag), gold (Au), aluminum (Al), a carbon nano-tube, and the combination thereof.

As described above, according to the embodiment, the copper pad and the adhesive member are formed on the semiconductor package substrate through the hybrid bump technology without the expensive dummy die, so that the productivity of a package system can be improved and the product cost can be reduced FIGS. 17 to 23 are sectional views showing the method for fabricating the semiconductor package substrate shown in FIG. 16 in the sequence of the process steps.

First, after preparing the insulating substrate 210 as shown in FIG. 17, a metallic layer 220 is stacked on at least one surface of the insulating substrate 110.

If the insulating substrate 210 includes an insulating layer, the stack structure of the insulating layer and the metallic layer 120 may be a typical copper clad laminate (CCL) structure.

In addition, the metallic layer 220 may be formed on the insulating substrate 210 by performing an electroless plating scheme. If the metallic layer 220 is formed through the electroless plating scheme, the roughness is applied to the surface of the insulating substrate 210, so that the plating process can be smoothly performed.

The insulating substrate 210 may include epoxy-based resin or polyimide-based resin instead of the expensive ceramic material representing high thermal conductivity. The metallic layer 220 may include a copper thin film including copper high electrical conductivity and low resistance.

Thereafter, as shown in FIG. 4, the circuit pattern 225 is formed by etching metallic layers 220, which are formed at the upper and lower portions of the insulating substrate 210, at a predetermined pattern.

In this case, the circuit pattern 225 may be formed through the etching process based on the photolithography process or through a laser process to directly form a pattern by using the laser.

In addition, the circuit pattern 225 may be formed on the upper and lower portions of the insulating substrate 210. Alternatively, the circuit pattern 225 may be formed only on the upper portion of the insulating substrate 210.

Next, the protective layer 230 is formed on the upper and lower portions of the insulating substrate 210 to bury the circuit pattern 225.

The protective layer 230 is to protect the surface of the insulating substrate 210 or the circuit pattern 225. The protective layer 230 may include at least one layer including one of solder resist (SR), an oxide, and gold (Au).

Next, the protective layer 230 formed on the lower portion of the insulating substrate 210 is processed, thereby exposing the surface of the circuit pattern 225 formed on the bottom surface of the insulating substrate 210.

Thereafter, the first adhesive member 245 is formed on the circuit pattern 225.

Thereafter, as shown in FIG. 18, the plating seed layer 250 is formed on the protective layer 230 formed on the upper portion of the insulating substrate 210.

The plating seed layer 250 may be formed through the chemical copper plating scheme.

The chemical copper plating scheme may be performed in the sequence of a degreasing process, a soft etching process, a pre-catalyst process, a catalyst treatment process, an accelerator process, an electroless plating process, and an anti-oxidation treatment process.

In addition, the copper plating scheme is classified into a heavy copper plating scheme (the thickness of about 2), a medium copper plating scheme (the thickness of 1 to 2), and a light copper plating scheme (the thickness of 1 or less) according to the thicknesses. In this case, the plating seed layer 250 having the thickness of 0.5 to 1.5 is formed through the medium copper plating scheme or the light copper plating scheme.

Thereafter, as described in the first embodiment, a dry film may be formed on the plating seed layer 250. In this case, the dry film (not shown) may have a window to open a portion opposite to the region in which the pad 270 is formed.

Thereafter, the first pad 272 is filled in the window of the dry film.

The first pad 272 may be formed by electroless-plating metal such as copper (Cu) using the plating seed layer 250 as a seed layer.

Thereafter, the formed dry film is removed.

Thereafter, as shown in FIG. 19, the dry film 260 is formed on the plating seed layer 250.

In this case, the dry film 260 may bury a portion of the surface of the first pad 272.

In other words, the dry film 260 may have an opening to expose the surface of the first pad 272. In this case, the width of the opening of the dry film 260 is narrower than the width of the top surface of the first pad 272.

Thereafter, as shown in FIG. 20, the second pad 274 is formed on the first pad 272 by using the dry film 260 as a mask, so that the second pad 274 is filled in the opening.

In this case, the width of the opening is narrow than the width of the top surface of the first pad 272. Accordingly, the width of the second pad 274 is narrower than the width of the first pad 272.

The pad 270 includes the first and second pads 272 and 274. The first pad 272 has a width different from that of the second pad 274 because the adhesive strength with the second adhesive member 280 is increased, so that the reliability of the semiconductor package substrate 200 can be improved.

Next, as shown in FIG. 21, the plating seed layer 250 is removed from a remaining portion except for the region for the first pad 272.

In this case, a portion of the plating seed layer 250 exists under the first pad 272, so that the whole structure of the first pad 272 includes the plating seed layer 250.

As described above, the first pad 272 including the plating seed layer 250 is formed on the protective layer 230, and the second pad 274 is formed with the width, which is narrower than that of the first pad 272, on the first pad 272

Next, as shown in FIG. 23, the second adhesive member 280 is formed on the pad 270.

In this case, the second adhesive member 280 may be formed by using the solder ball or the micro-ball.

If the second adhesive member 280 is formed by using the solder ball or the micro-ball, the second adhesive member 280 may be formed through processes such as a flux printing scheme, a ball printing scheme, a reflow scheme, a deflux scheme, and a coining scheme.

Alternatively, the second adhesive member may be formed by coating adhesive paste. In addition, the second adhesive member may be formed by using a copper core solder ball including a copper ball and a solder ball surrounding the circumference of the copper ball.

As described above, according to the embodiment, the copper pad and the adhesive member are formed on the semiconductor package substrate through the hybrid bump technology without the expensive dummy die, so that the productivity of a package system can be improved and the product cost can be reduced In addition, according to the embodiment, the pad is formed by using the stack structure of multiple layers, thereby improving the adhesive strength with the adhesive member, so that the reliability of the semiconductor package substrate can be improved.

FIGS. 24 and 25 are views showing a package system according to the embodiment.

Referring to FIGS. 24 and 25, the package system includes the semiconductor package substrate 100 and the memory chip 300 formed on the semiconductor package substrate 100.

The memory chip 300 may include a NAND flash memory chip.

In this case, the memory chip 300 is attached to the semiconductor package substrate 100 by the pad 170 and the second adhesive member 180 which are formed on the semiconductor package substrate 100.

As described above, the memory chip 300 is attached to the pad 170 and the second adhesive member 180 through a hybrid bump technology during the process of fabricating the semiconductor package substrate 100 without using an expensive dummy die separately from the process of fabricating the semiconductor package substrate 100 in order to attach the memory chip 300.

FIG. 26 illustrates the comparison in the package system between the related art and the embodiment.

Referring to FIG. 26, according to the related art, an expensive dummy die 20 is formed on the package substrate 10, and a memory chip 30 is formed on the dummy die 20.

Accordingly, the process of fabricating the package system according to the related art is mainly divided into three steps.

The first step is to fabricate the package substrate 10.

In addition, the second step is to form the dummy die 20 on the fabricated package substrate 10. In this case, due to the process characteristics, the first and second steps are not performed at once, but performed through a plurality of sub-steps.

The third step is to form the semiconductor chip 30 on the dummy die 20.

However, according to the embodiment, the memory chip 300 is attached onto the pad 170 and the second adhesive member 180 through the hybrid bump technology.

Accordingly, the process of fabricating the package system according to the embodiment is mainly divided into two sub-steps.

The first step is to fabricate the package substrate 100. In this case, the step of fabricating the package substrate 100 includes the step of forming the pad 170 and the second adhesive member 180 formed through the hybrid bump technology.

In addition, the second step is to attach the memory chip 300 onto the pad 170 and the second adhesive member 180 formed through the hybrid bump technology.

As described above, according to the embodiment, the memory chip 300 is attached onto the pad 170 and the second adhesive member 180 formed through the hybrid bump technology without using the expensive dummy die, so that the fabrication cost can be reduced, and the fabrication process can be simplified.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A semiconductor package substrate comprising:
an insulating layer;
a circuit pattern on a first side and an opposite side of the insulating layer;
a solder resist disposed on the insulating layer to cover the circuit pattern on the first side and partially covering the circuit pattern on the opposite side of the insulating layer, wherein the solder resist on the opposite side of the insulating layer has at least one opening to expose a surface of the circuit pattern on the opposite side of the insulating layer;
a plating seed layer disposed on the solder resist on the first side of the insulating layer and protruded from a top surface of the solder resist;
a pad disposed on the plating seed layer; and
an adhesive member disposed on the pad,
wherein a bottom surface of the plating seed layer is directly brought into contact with the top surface of the solder resist,
wherein the opening of the solder resist on the opposite side of the insulation layer has a width narrower than that of the circuit pattern, and an edge region of the circuit pattern is covered by the solder resist,
wherein the solder resist on the opposite side of the insulating layer is exposed to an outside,
wherein a memory chip is attached on the adhesive member and supported by the pad, and
wherein the bottom surface of the plating seed layer portions lie in the same plane as the top surface of the solder resist,
wherein the pad comprises:
a first pad disposed on the plating seed layer and has a first width, and
a second pad disposed on the first pad and has a second width different from the first width,
wherein the second width of the second pad is narrower than the first width of the first pad,
wherein side surfaces of the plating seed layer, the first pad and the second pad are exposed from an outside, wherein the top surface of the solder resist is positioned at a lower level than a lowermost surface of the first pad,
wherein the adhesive member is a copper core solder ball,
wherein the second pad is separated from the plating seed layer.

2. A package system comprising:
a semiconductor package substrate including an insulating layer, a circuit pattern on a first surface of the insulating layer and an opposite surface of the insulating layer, and a solder resist disposed on the first and opposite surfaces of the insulating layer to cover the circuit pattern on the first surface of the insulating layer and partially cover the circuit pattern on the opposite surface of the insulating layer and having at least one opening to expose a surface of the circuit pattern on the opposites surface of the insulating layer; and
a memory chip attached to the semiconductor package substrate,
wherein the semiconductor package substrate comprises:
a plating seed layer disposed on the solder resist on the first surface of the insulating layer and protruded from a top surface of the solder resist;
a pad disposed on the plating seed layer; and
an adhesive member disposed on the pad,
wherein a bottom surface of the plating seed layer is directly brought into contact with the top surface of the solder resist, and
wherein the opening of the solder resist on the opposite surface of the insulating layer has a width narrower than that of the circuit pattern, and an edge region of the circuit pattern is covered by the solder resist,
wherein the solder resist on the opposite surface of the insulating layer is exposed to an outside,
wherein a memory chip is attached on the adhesive member and supported by the pad,
wherein the adhesive member is a copper core solder ball,
wherein the bottom surface of the plating seed layer portions lie in the same plane as the top surface of the solder resist,
wherein the pad comprises:
a first pad disposed on the plating seed layer and has a first width, and
a second pad disposed on the first pad and has a second width different from the first width,
wherein the second width of the second pad is narrower than the first width of the first pad,
wherein side surfaces of the plating seed layer, the first pad and the second pad are exposed from an outside, respectively,
wherein the top surface of the solder resist is positioned at a lower level than a lowermost surface of the first pad,
wherein the second pad is separated from the plating seed layer.

3. A method for manufacturing a package system, the method comprising:
forming a circuit pattern on a first surface of an insulating layer and an opposite surface of the insulating layer;
forming a solder resist on the insulating layer to cover the circuit pattern on the first surface and partially cover the circuit pattern on the opposite surface of the insulating layer, wherein the solder resist on the opposite surface of the insulating layer has at least one opening to expose a surface of the circuit pattern on the opposite surface of the insulating layer;

forming a plating seed layer on the solder resist on the first surface of the insulating layer;

attaching a dry film, which has an opening to expose a region for formation of a pad, on the plating seed layer;

forming the pad on the plating layer by filling the opening of the dry film; and forming an adhesive member on the formed pad, wherein a top surface of the plating seed layer is protruded from a top surface of the solder resist;

wherein a bottom surface of the plating seed layer is directly brought into contact with the top surface of the solder resist, wherein the opening of the solder resist on the opposite surface of the insulating layer has a width narrower than that of the circuit pattern, and an edge region of the circuit pattern is covered by the solder resist, wherein the solder resist on the opposite surface of the insulating layer is exposed to an outside, wherein a memory chip is attached on the adhesive member and supported by the pad, wherein the bottom surface of the plating seed layer portions lie in the same plane as the top surface of the solder resist, wherein the pad comprises:

a first pad disposed on the plating seed layer and has a first width, and a second pad disposed on the first pad and has a second width different from the first width, wherein the second width of the second pad is narrower than the first width of the first pad, wherein side surfaces of the plating seed layer, the first pad and the second pad are exposed from an outside, respectively, wherein the top surface of the solder resist is positioned at a lower level than a lowermost surface of the first pad, wherein the adhesive member is a copper core solder ball, wherein the second pad is separated from the plating seed layer.

\* \* \* \* \*